United States Patent
Jeon

(10) Patent No.: US 12,362,286 B2
(45) Date of Patent: Jul. 15, 2025

(54) PRINTED CIRCUIT BOARD AND SEMICONDUCTOR PACKAGE INCLUDING THE SAME

(71) Applicant: SAMSUNG ELECTRONICS CO., LTD., Suwon-si (KR)

(72) Inventor: Byeonguk Jeon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 490 days.

(21) Appl. No.: 17/936,640

(22) Filed: Sep. 29, 2022

(65) Prior Publication Data

US 2023/0207481 A1    Jun. 29, 2023

(30) Foreign Application Priority Data

Dec. 27, 2021    (KR) .......................... 10-2021-0188417

(51) Int. Cl.
*H01L 25/065*    (2023.01)
*H01L 23/544*    (2006.01)

(52) U.S. Cl.
CPC ........ *H01L 23/544* (2013.01); *H01L 25/0657* (2013.01); *H01L 2223/54426* (2013.01)

(58) Field of Classification Search
CPC .... H01L 23/544; H01L 25/0657; H01L 25/50
See application file for complete search history.

(56) References Cited

U.S. PATENT DOCUMENTS

| | | |
|---|---|---|
| 7,750,457 B2 | 7/2010 | Seko |
| 2008/0284048 A1 | 11/2008 | Kim et al. |
| 2012/0133381 A1* | 5/2012 | Bruland .............. H01L 25/0657 257/E21.531 |
| 2013/0344655 A1* | 12/2013 | Ohba ................ H01L 21/76898 438/109 |
| 2017/0315099 A1* | 11/2017 | Rothberg ............. A61B 8/4483 |
| 2017/0338273 A1* | 11/2017 | Fujiwara ............... H10F 39/026 |
| 2018/0264519 A1 | 9/2018 | Sudol |
| 2022/0352000 A1* | 11/2022 | Li ........................ H10H 20/857 |
| 2023/0290740 A1* | 9/2023 | Ahn ....................... H01L 25/50 |

FOREIGN PATENT DOCUMENTS

| | | |
|---|---|---|
| JP | 4024773 B2 | 10/2007 |
| JP | 5205189 B2 | 2/2013 |
| KR | 100809726 B1 | 3/2008 |

* cited by examiner

*Primary Examiner* — Thao P Le

(74) *Attorney, Agent, or Firm* — Myers Bigel, P.A.

(57) ABSTRACT

A semiconductor package may include a board, a first semiconductor chip mounted on the board, and a plurality of second semiconductor chips stacked on the first semiconductor chip. The board may include alignment marks on a top surface of the board and which are arranged in spaced apart relationship along a first direction. Each alignment mark includes a first side surface parallel to the first direction and a second side surface parallel to a second direction perpendicular to the first direction. A coupling pad is on the top surface of the board and between adjacent ones of the alignment marks. The first side surfaces may be collinear in the first direction. Each of the second semiconductor chips may include end surfaces, which are parallel to the second direction and are collinear with respective second side surfaces in the second direction.

20 Claims, 18 Drawing Sheets

PRINTED CIRCUIT BOARD AND SEMICONDUCTOR PACKAGE INCLUDING THE SAME

CROSS-REFERENCE TO RELATED APPLICATIONS

This U.S. non-provisional patent application claims priority under 35 U.S.C. § 119 to Korean Patent Application No. 10-2021-0188417, filed on Dec. 27, 2021, in the Korean Intellectual Property Office, the entire contents of which are hereby incorporated by reference.

BACKGROUND OF THE INVENTION

The present disclosure relates to a printed circuit board and a semiconductor package including the same, and in particular, to a printed circuit board, in which an alignment mark displaying a mounting position of an electronic component is formed, and a semiconductor package including the same.

In a process of fabricating a semiconductor package, an alignment mark may be formed on a printed circuit board to mount semiconductor chips at precise positions on the printed circuit board. A method of patterning a solder resist layer on the printed circuit board using an etching process or a method of forming a metal alignment mark on a solder resist layer may be used to form the alignment mark on the printed circuit board. In addition, the alignment mark may be used to monitor and test whether chips are attached at desired positions, during or after a process of attaching the chips on the printed circuit board.

SUMMARY

An embodiment of the inventive concept provides a method of preventing a short circuit from being formed between an alignment mark and a coupling pad, when semiconductor chips of different kinds are mounted on a printed circuit board.

According to an embodiment of the inventive concept, a semiconductor package may include a board, a first semiconductor chip mounted on the board, and a plurality of second semiconductor chips stacked on the first semiconductor chip. The board may include alignment marks on a top surface of the board and arranged in spaced apart relationship along a first direction, wherein each alignment mark comprises a first side surface parallel to the first direction and a second side surface parallel to a second direction that is perpendicular to the first direction, and a coupling pad on the top surface of the board between a pair of adjacent alignment marks. The first side surfaces of the alignment marks are collinear in the first direction. Each of the second semiconductor chips may include an end surface parallel to the second direction. The end surface of each of the second semiconductor chips is collinear with a second side surface of a respective one of the alignment marks.

According to an embodiment of the inventive concept, a semiconductor package may include a board, a first semiconductor chip mounted on the board, and a plurality of second semiconductor chips stacked on the first semiconductor chip. The board may include a base layer, a circuit line on the base layer, wherein the circuit line extends in a first direction, and wherein the circuit line comprises a first line side surface and a second line side surface, alignment marks extending from the first line side surface of the circuit line in a second direction perpendicular to the first direction, wherein each alignment mark comprises a first side surface parallel to the first direction and a second side surface parallel to the second direction, and a coupling pad on the base layer and spaced apart from the alignment marks. The first side surfaces of the alignment marks are collinear in the first direction, and the coupling pad may include a first portion and a second portion. The first portion of the coupling pad may be between an adjacent pair of the alignment marks, and the second portion extends from the first portion in the second direction beyond the first side surfaces of the adjacent pair of alignment marks.

According to an embodiment of the inventive concept, a board may include a base layer, alignment marks on the base layer and arranged in spaced apart relationship along a first direction, wherein each of the alignment marks comprises a first side surface parallel to the first direction and a second side surface parallel to a second direction perpendicular to the first direction, and a coupling pad on the base layer and spaced apart from the alignment marks. The first side surfaces of the alignment marks are collinear in the first direction, and the coupling pad may include a first portion and a second portion. The first portion of the coupling pad may be between a pair of adjacent alignment marks, and the second portion extends from the first portion in the second direction beyond the first side surfaces of the pair of adjacent alignment marks.

DETAILED DESCRIPTION

Example embodiments of the inventive concepts will now be described more fully with reference to the accompanying drawings, in which example embodiments are shown.

Figure 1:
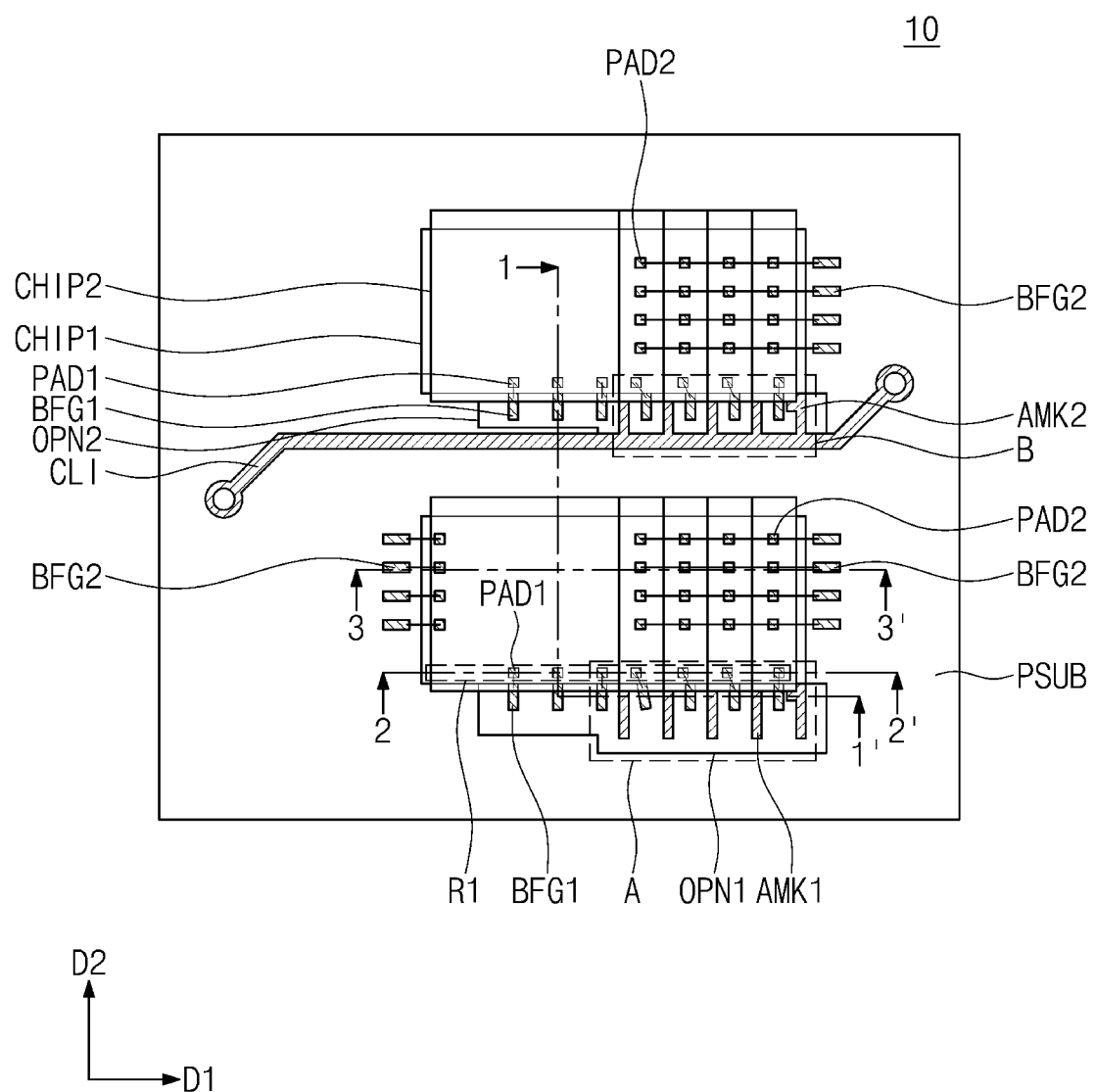
FIG. 1 is a plan view illustrating a semiconductor package including a board according to an embodiment of the inventive concept.
Figure 2:
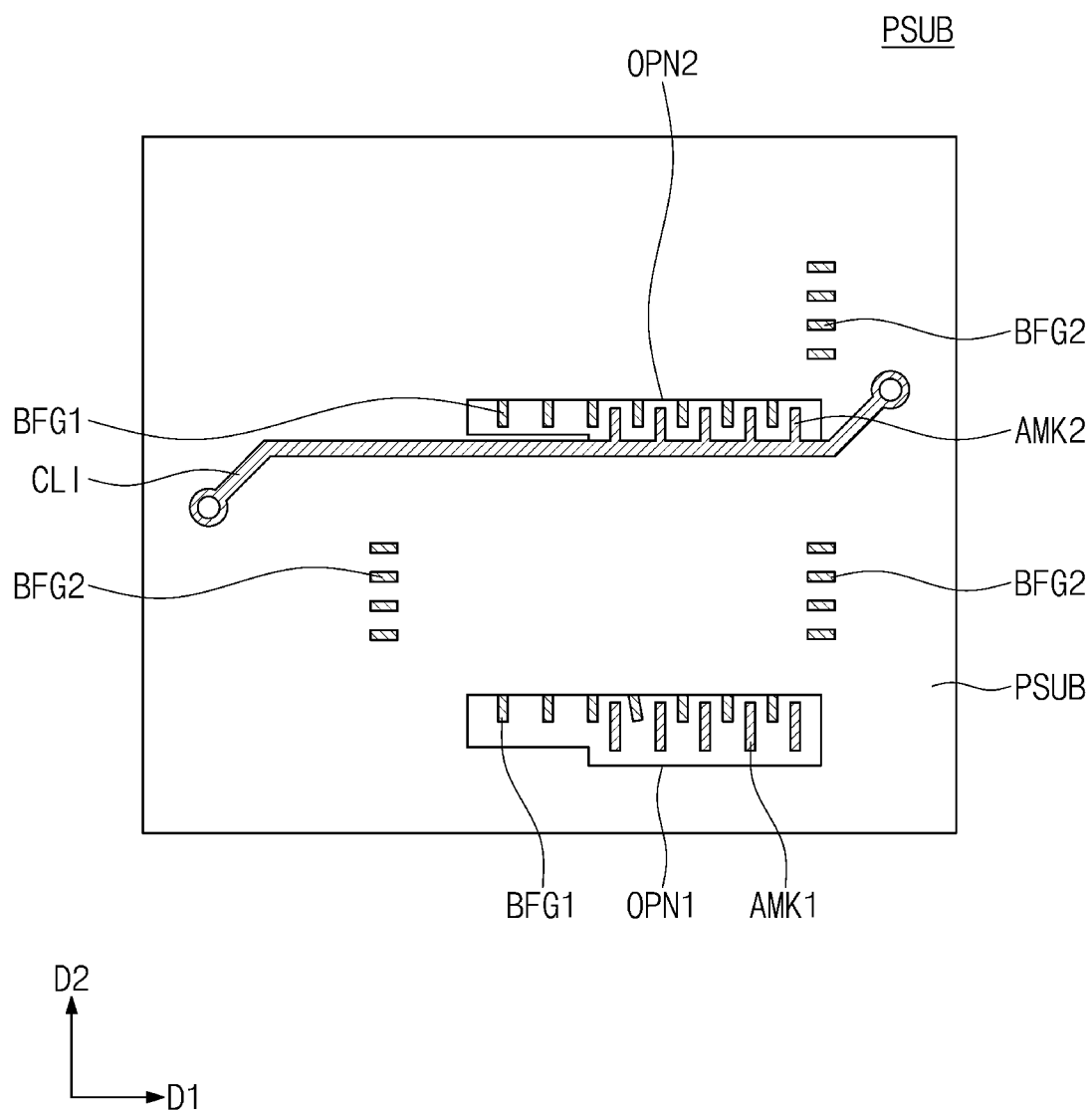
FIG. 2 is a plan view illustrating a board according to an embodiment of the inventive concept.
Figure 3:
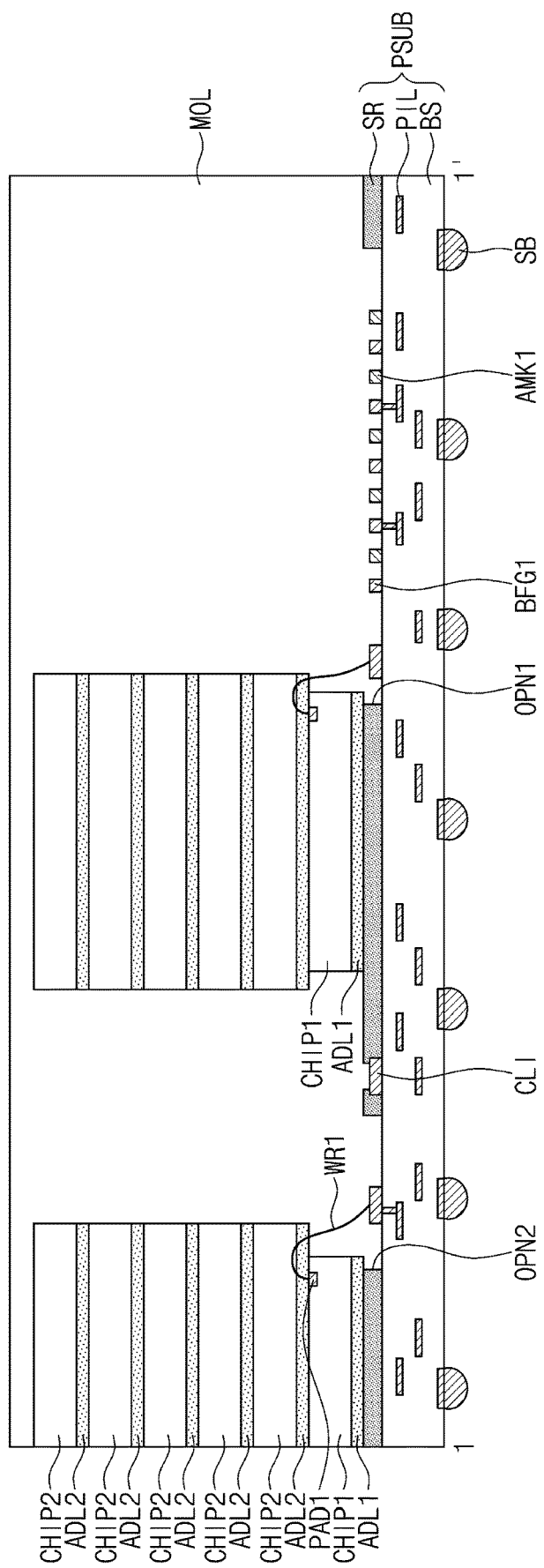
FIG. 3 is a sectional view taken along a line 1-1' of FIG. 1.
Figure 4:
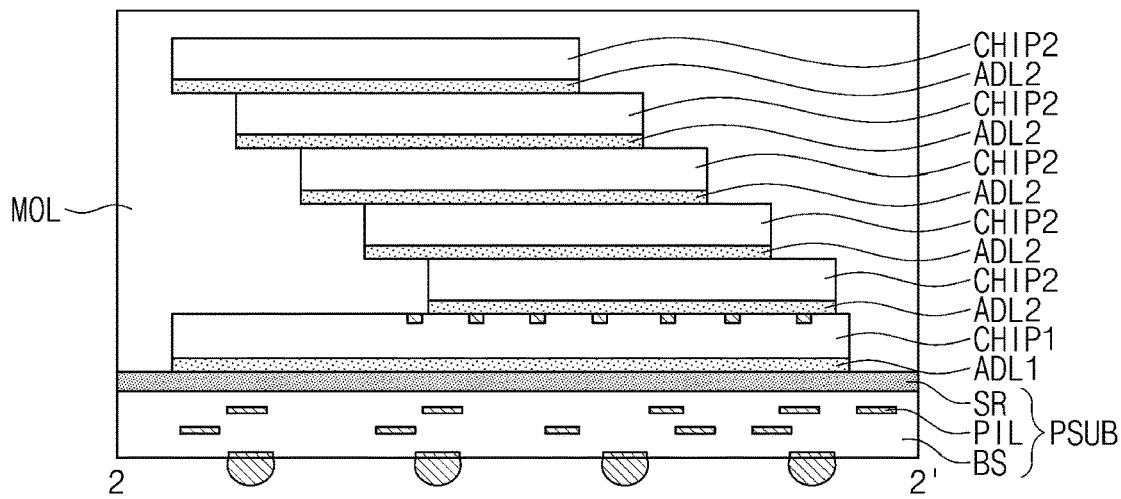
FIG. 4 is a sectional view taken along a line 2-2' of FIG. 1.
Figure 5:
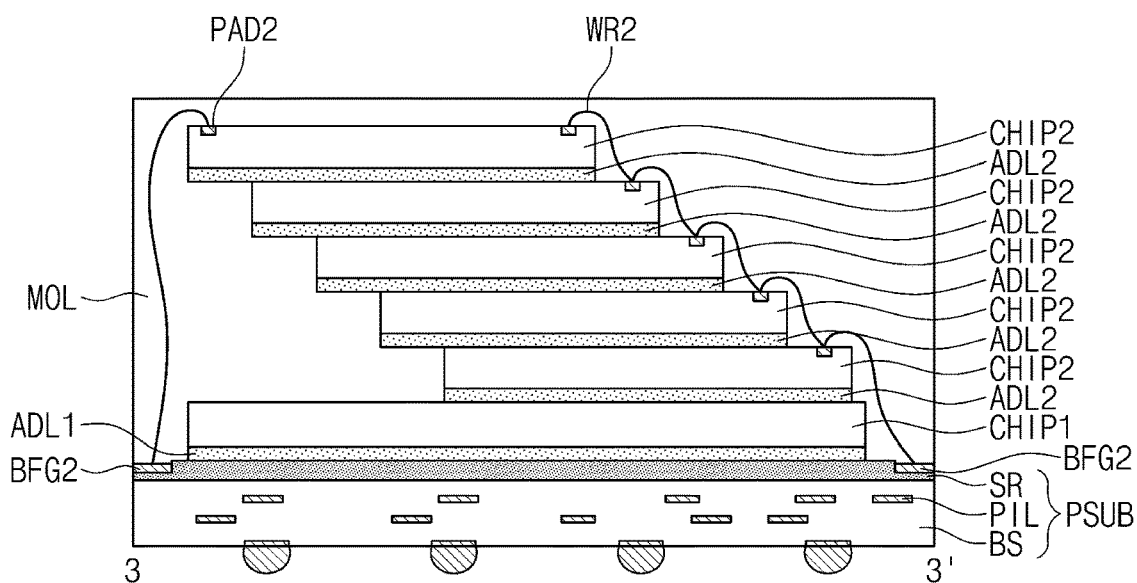
FIG. 5 is a sectional view taken along a line 3-3' of FIG. 1.
Figure 6:
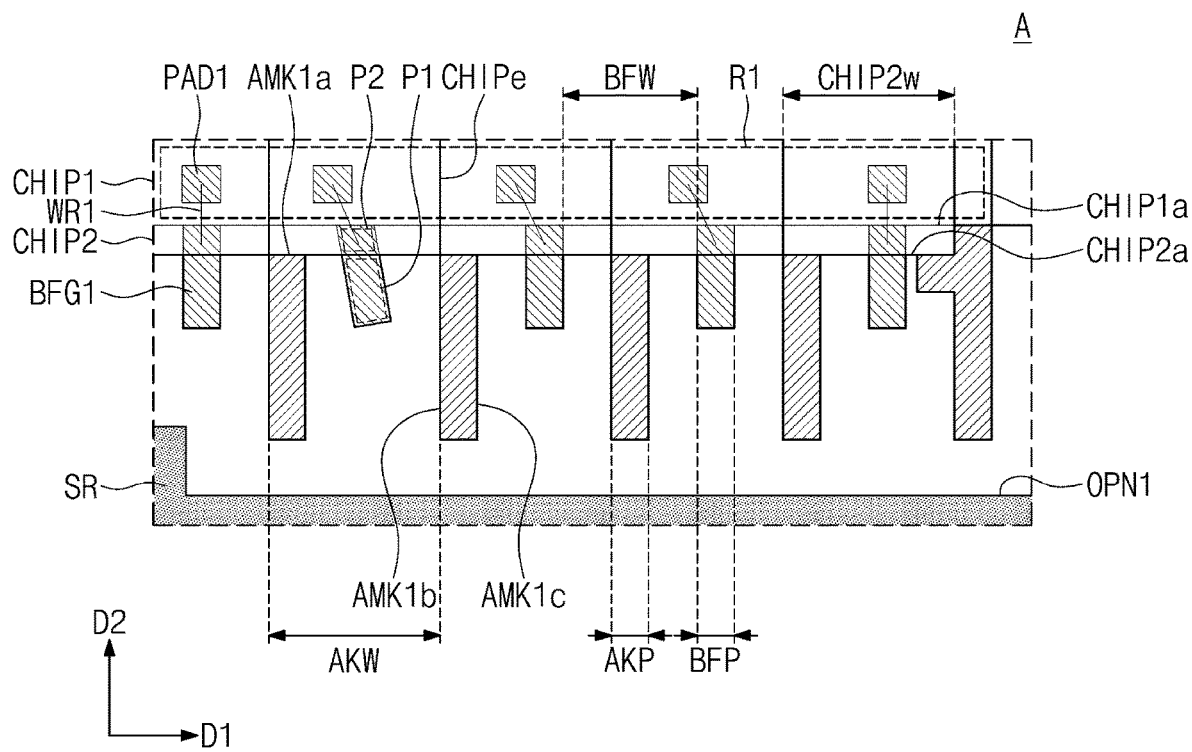
FIG. 6 is an enlarged plan view illustrating a portion 'A' of FIG. 1.
Figure 7:
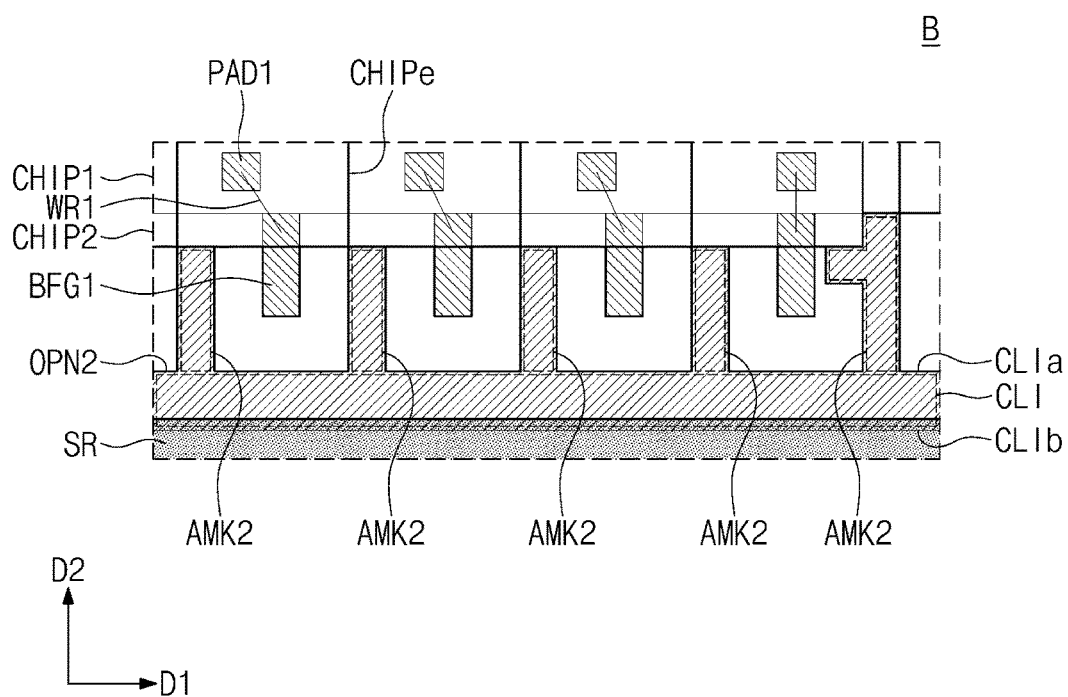
FIG. 7 is an enlarged plan view illustrating a portion 'B' of FIG. 1.

FIG. 1 is a plan view illustrating a semiconductor package including a board according to an embodiment of the inventive concept. FIG. 2 is a plan view illustrating a board according to an embodiment of the inventive concept. FIG. 3 is a sectional view taken along a line 1-1' of FIG. 1. FIG. 4 is a sectional view taken along a line 2-2' of FIG. 1. FIG. 5 is a sectional view taken along a line 3-3' of FIG. 1. FIG. 6 is an enlarged plan view illustrating a portion 'A' of FIG. 1. FIG. 7 is an enlarged plan view illustrating a portion 'B' of FIG. 1. Hereinafter, a printed circuit board according to an embodiment of the inventive concept and a semiconductor package including the same will be described in more detail with reference to FIGS. 1 to 7.

Referring to FIGS. 1 to 5, a semiconductor package according to an embodiment of the inventive concept may include a board PSUB, a first semiconductor chip CHIP1 mounted on the board PSUB, second semiconductor chips CHIP2 provided on the first semiconductor chip CHIP1, terminals SB provided on a bottom surface of the board PSUB, and a mold layer MOL provided on the board PSUB.

The board PSUB may include a base layer BS, board lines PIL provided in the base layer BS, coupling pads BFG1 and BFG2 and alignment marks AMK1 and AMK2 provided on the base layer BS, a circuit line CLI provided on the base layer BS, and a solder resist layer SR provided on the base layer BS. In an embodiment, the board PSUB may include a printed circuit board.

The base layer BS may be formed of or include at least one material selected from the group consisting of phenolic resin, epoxy resin, and polyimide. For example, the base layer BS may be formed of or include at least one material selected from the group consisting of frame retardant 4 (FR4), tetrafunctional epoxy, polyphenylene ether, epoxy/polyphenylene oxide, bismaleimide triazine (BT), thermount, cyanate ester, polyimide, and liquid crystal polymers.

The coupling pads BFG1 and BFG2 may be provided on a top surface of the base layer BS. In an embodiment, the coupling pads BFG1 and BFG2 may include signal coupling pads and power/ground coupling pads. The coupling pads BFG1 and BFG2 may be electrically connected to the board lines PIL. The coupling pads BFG1 and BFG2 and the board lines PIL may include at least one of conductive or metallic materials. The conductive material may include, for example, aluminum, copper, and nickel.

The coupling pads BFG1 and BFG2 may be spaced apart from each other and may be electrically disconnected from each other. The coupling pads BFG1 and BFG2 may include first coupling pads BFG1, which are connected to the first semiconductor chip CHIP1, and second coupling pads BFG2, which are connected to the second semiconductor chip CHIP2. The first coupling pads BFG1 may be arranged in a first direction D1. The second coupling pads BFG2 may be arranged in a second direction D2 perpendicular to the first direction D1, as illustrated in FIG. 1.

The circuit line CLI and the alignment marks AMK1 and AMK2 may be provided on the top surface of the base layer BS. The circuit line CLI may be extended along a top surface of the board PSUB. The circuit line CLI and the alignment marks AMK1 and AMK2 may be formed of or include at least one of conductive materials. For example, the conductive materials may include aluminum, copper, tungsten, molybdenum, and cobalt. The alignment mark may include first alignment marks AMK1 and second alignment marks AMK2.

The first alignment marks AMK1 may be disposed in an outer region of the board PSUB or adjacent to an edge of the board PSUB. The first alignment marks AMK1 may be disposed adjacent to the first and second semiconductor chips CHIP1 and CHIP2. The first alignment marks AMK1 may be spaced apart from each other and may be electrically disconnected from each other. The first alignment marks AMK1 may be arranged in (i.e., spaced apart along) the first direction D1. The first alignment marks AMK1 may extend along (i.e., are elongate along) the second direction D2 that is perpendicular to the first direction D1.

The second alignment marks AMK2 may be connected to the circuit line CLI, which is provided on the top surface of the board PSUB. For example, the second alignment marks AMK2 may include a stub of the circuit line CLI. The second alignment marks AMK2 and the circuit line CLI may form a single object and may be formed of the same material. The second alignment marks AMK2 may be arranged in (i.e., spaced apart along) the first direction D1. The second alignment marks AMK2 may extend along (i.e., are elongate along) the second direction D2.

The solder resist layer SR may be provided on the top surface of the base layer BS. The solder resist layer SR may be provided to partially cover a top surface of the circuit line CLI. The solder resist layer SR may expose a portion of the top surface of the circuit line CLI. The solder resist layer SR may include a first open region OPN1 and a second open region OPN2. The first alignment marks AMK1 and the first coupling pads BFG1 may be disposed in the first open region OPN1. The second alignment marks AMK2 and the first coupling pads BFG1 may be disposed in the second open region OPN2. A top surface of the solder resist layer SR may be located at a level higher than the top surfaces of the circuit line CLI and the coupling pads BFG1 and BFG2.

The first coupling pads BFG1 and the alignment marks AMK1 and AMK2, which are provided in the open regions OPN1 and OPN2, will be described in more detail with reference to FIGS. 6 and 7.

The solder resist layer SR may include a solder resist layer that can be curable by at least one of heat or UV light. The solder resist layer SR may be formed of or include one or more photosensitive materials. For example, the photosensitive materials may include at least one of polyurethane resins, inorganic fillers, polymerized compounds, and photopolymerization initiators. The solder resist layer SR may be formed of or include one or more insulating materials. For example, the insulating materials may include epoxy resins, polyimide resins, BT resins, and Teflon resins.

The terminals SB may be provided on a bottom surface of the base layer BS. In an embodiment, the terminals SB may include a signal terminal and a power/ground terminal, which are electrically disconnected from each other. The signal coupling pad on the board PSUB may be electrically and respectively connected to the signal terminal through the board lines PIL. The power/ground terminals on the board PSUB may be electrically and respectively connected to the power/ground coupling pads through the board lines PIL. Each of the signal terminal and the power/ground terminals may include a solder ball. For example, the solder ball may be formed of or include at least one of tin, bismuth, lead, silver, or alloys thereof.

The terminals SB may be coupled to an external device. An external electrical signal and/or data may be transmitted or received to or from the signal coupling pad through the signal terminal. A ground voltage or a power voltage may be supplied to the power/ground coupling pads through the power/ground terminal.

As will be described below, the first semiconductor chip CHIP1 and the second semiconductor chip CHIP2 may be electrically connected to the external device through the terminals SB provided on the board PSUB.

The first semiconductor chips CHIP1 may be provided on the top surface of the board PSUB. The first semiconductor chip CHIP1 may include integrated circuits provided therein, and the integrated circuits may include memory circuits. For example, the first semiconductor chip CHIP1 may be a dynamic random access memory (DRAM) chip. The first semiconductor chips CHIP1 may be of the same kind, but the inventive concept is not limited to this example.

The first semiconductor chips CHIP1 may be disposed in (i.e. spaced apart along) the second direction D2, as illustrated in FIG. 1. The first semiconductor chips CHIP1 may be spaced apart from each other, and the circuit line CLI may be provided between the first semiconductor chips CHIP1, as illustrated in FIG. 1. Each of the first semiconductor chips CHIP1 may include first signal pads PAD1. The first signal pads PAD1 may be exposed to the outside of the first semiconductor chip CHIP1 near a top surface of the first semiconductor chip CHIP1. The first signal pads PAD1 may be electrically connected to the first coupling pads BFG1 on the board PSUB through first signal connecting portions WR1. The first signal connecting portion WR1 may include a bonding wire. The bonding wire may be formed of or include at least one of metallic materials (e.g., gold or aluminum).

The second semiconductor chips CHIP2 may be stacked on the first semiconductor chip CHIP1 in a third direction D3. The third direction D3 may be perpendicular to each of the first and second directions D1 and D2 and may be normal to the top surface of the board PSUB. The stacked second semiconductor chips CHIP2 may be disposed such that end surfaces CHIPe thereof are not overlapped with each other (i.e., the second semiconductor ships CHIP2 are staggered). For example, the stacked second semiconductor chips CHIP2 may form a staircase structure, as illustrated in FIGS. 4 and 5. Positions, at which the second semiconductor chips CHIP2 are stacked, may be displayed by the alignment marks AMK1 and AMK2.

Each of the second semiconductor chip CHIP2 may include integrated circuits provided therein, and the integrated circuits may include memory circuits. The second semiconductor chip CHIP2 may include a nonvolatile memory chip. For example, the second semiconductor chip CHIP2 may be a VNAND device.

Each of the second semiconductor chips CHIP2 may include second signal pads PAD2. The second signal pads PAD2 may be exposed to the outside of the second semiconductor chip CHIP2 near a top surface of the second semiconductor chip CHIP2. The second signal pads PAD2 may be electrically connected to the second coupling pads BFG2 on the board PSUB through second signal connecting portions WR2. The second signal connecting portion WR2 may include a bonding wire. The first and second signal connecting portions WR1 and WR2 may be exposed to the outside of the first and second semiconductor chips CHIP1 and CHIP2.

The number of the stacked second semiconductor chips CHIP2 is not limited to the illustrated example and may be variously changed. The number of the alignment marks AMK1 and AMK2 may correspond to the number of the second semiconductor chips CHIP2. As an example, the more the stacked second semiconductor chips CHIP2, the more the alignment marks AMK1 and AMK2 on the board P SUB.

A first adhesive layer ADL1 may be interposed between the board PSUB and the first semiconductor chip CHIP1. A second adhesive layer ADL2 may be provided between the first semiconductor chip CHIP1 and the second semiconductor chip CHIP2. The second adhesive layer ADL2 may also be provided between the second semiconductor chips CHIP2. The second adhesive layer ADL2 may be extended along a bottom surface of the second semiconductor chip CHIP2. The first and second signal connecting portions WR1 and WR2 may be provided to penetrate the second adhesive layer ADL2. The adhesive layers ADL1 and ADL2 may be formed of or include at least one of insulating polymers.

The mold layer MOL may be provided on the board PSUB to cover the first semiconductor chip CHIP1, the second semiconductor chips CHIP2, and signal connecting portions. The mold layer MOL may be formed of or include at least one of insulating polymers (e.g., epoxy-based molding compounds).

Hereinafter, the disposition of the alignment marks AMK1 and AMK2, the coupling pads BFG1, and the semiconductor chips CHIP1 and CHIP2 will be described in more detail with reference to FIGS. 6 and 7.

Referring to FIG. 6, the first alignment marks AMK1 and the first coupling pads BFG1 may be disposed in the first open region OPN1 of the solder resist layer SR on the board PSUB.

The first alignment marks AMK1 may be spaced apart from each other in the first direction D1 and may be extend in the second direction D2, as illustrated. One of the first alignment marks AMK1, which is adjacent to the outermost edge of the second semiconductor chip CHIP2, may have an uneven shape corresponding to a corner of the second semiconductor chip CHIP2, as illustrated.

The first alignment marks AMK1 may include a first side surface AMK1$a$, which is parallel to the first direction D1, a second side surface AMK1$b$, which is perpendicular to the first side surface AMK1$a$ and parallel to the second direction D2, and a third side surface AMK1$c$, which is parallel to the second direction D2 and is opposite to the second side surface AMK1$b$. The first side surface AMK1$a$ may be adjacent to the second semiconductor chip CHIP2. The first side surfaces AMK1$a$ of the first alignment marks AMK1 may be disposed on a straight line parallel to the first direction D1, as illustrated in FIG. 6. In other words, the first side surfaces AMK1$a$ are collinear along the first direction D1.

A width AKP of the first alignment mark AMK1 may be defined as a distance between the second and third side surfaces AMK1$b$ and AMK1$c$ of the first alignment mark AMK1. The width AKP of the first alignment mark AMK1 may range from 10 μm to 40 μm. A distance AKW between adjacent ones of the second side surfaces AMK1$b$ of the first alignment marks AMK1 may be defined. The distance AKW between the adjacent ones of the first alignment marks AMK1 may range from 30 μm to 1000 μm. The distance AKW between the first alignment marks AMK1 may be changed depending on a distance CHIP2$w$ between the end surfaces CHIPe of the second semiconductor chips CHIP2, as will be described below.

The first alignment marks AMK1 may be spaced apart from each other and may be electrically disconnected from each other. In other words, the first alignment marks AMK1 may be isolated within the first open region OPN1 and may be electrically disconnected from the circuit line CLI or the first coupling pads BFG1 adjacent thereto.

The first coupling pads BFG1 may be disposed in the first open region OPN1. The first coupling pads BFG1 may be disposed to be spaced apart from each other. A width BFP of the first coupling pad BFG1 may range from 10 μm to 40

µm. A distance BFW between the first coupling pads BFG1 may range from 30 µm to 1000 µm.

The first coupling pads BFG1 may include a first portion P1 and a second portion P2. The first portion P1 may be defined as a portion of the first coupling pad BFG1, which is disposed between an adjacent pair of the first alignment marks AMK1. The first portion P1 may be overlapped with the first alignment marks AMK1 in the first direction D1. In other words, a portion of the first coupling pad BFG1 may be disposed between the pair of the first alignment marks AMK1. The first portions P1 of the first coupling pads BFG1 and the first alignment marks AMK1 may be alternately arranged to be spaced apart from each other.

The second portion P2 may be defined as a portion of the first coupling pad BFG1 excluding the first portion P1. The second portion P2 may be extended from the first portion P1 in the second direction D2. The second portion P2 may protrude in the second direction D2 beyond the first side surface AMK1a of the first alignment mark AMK1 adjacent thereto. In other words, the first coupling pad BFG1 may include a portion that is not disposed between a pair of the first alignment marks AMK1.

As an example, the first portion P1 may be extended in the second direction D2. As another example, the first portion P1 may be spaced apart from the first alignment marks AMK1 and may be extended in a direction that is inclined (i.e., transverse) to both of the first and second directions D1 and D2. The first portions P1 may be electrically disconnected from the first alignment marks AMK1. Positions of the first coupling pads BFG1 and the first portion P1 of the first coupling pads BFG1 may be adjusted depending on an arrangement of the first alignment marks AMK1.

The first semiconductor chip CHIP1 may include a first chip side surface CHIP1a adjacent to the first coupling pads BFG1. The first chip side surface CHIP1a may be parallel to the first direction D1. The first semiconductor chip CHIP1 may include a first region R1. The first region R1 of the first semiconductor chip CHIP1 may be adjacent to the first chip side surface CHIP1a of the first semiconductor chip CHIP1.

The first signal pads PAD1 may be provided on the top surface of the first semiconductor chip CHIP1. The first signal pads PAD1 may be disposed on the first region R1 of the first semiconductor chip CHIP1. The first signal pads PAD1 may be disposed to be spaced apart from each other in the first direction D1. The first signal pads PAD1 may be spaced apart from each other by a uniform distance, but the inventive concept is not limited to this example; for example, the first signal pads PAD1 may be spaced apart from each other by at least two different distances.

The first signal connecting portion WR1 may be provided on a top surface of the first signal pad PAD1 on the first semiconductor chip CHIP1 and may be coupled to the first coupling pad BFG1 on the board PSUB. The first signal connecting portion WR1 may include a bonding wire.

The second semiconductor chips CHIP2 may be provided on the first semiconductor chip CHIP1. For example, the second semiconductor chip CHIP2 may cover the first region R1 of the first semiconductor chip CHIP1. However, the inventive concept is not limited to the illustrated example, and the second semiconductor chip CHIP2 may be provided on a region excluding the first region R1 to expose the first region R1 of the first semiconductor chip CHIP1.

Each of the second semiconductor chips CHIP2 may include a second chip side surface CHIP2a. The second chip side surface CHIP2a may be parallel to the first direction D1. The second chip side surfaces CHIP2a of the second semiconductor chips CHIP2 may be disposed on a straight line. The second chip side surface CHIP2a of the second semiconductor chip CHIP2 may be disposed to be parallel to the first side surface AMK1a of the first alignment mark AMK1. As an example, the second chip side surface CHIP2a of the second semiconductor chip CHIP2 and the first side surface AMK1a of the first alignment mark AMK1 may be located on a straight line. In this case, the first portion P1 may be defined as a portion of the first coupling pad BFG1, which is not vertically overlapped with the second semiconductor chip CHIP2.

Each of the second semiconductor chips CHIP2 may include an end surface CHIPe. The end surface CHIPe of the second semiconductor chips CHIP2 may be parallel to the second direction D2. The end surfaces CHIPe of the second semiconductor chips CHIP2 may be parallel to each other.

The end surfaces CHIPe of the second semiconductor chip CHIP2 may be respectively aligned to (i.e., collinear with) the second side surfaces AMK1b of the first alignment marks AMK1 in the second direction D2, as illustrated in FIG. 7. As an example, the end surface CHIPe of the second semiconductor chip CHIP2 and the second side surface AMK1b of the first alignment mark AMK1 may be arranged on a straight line parallel to the second direction D2 (i.e., the end surface CHIPe of the second semiconductor chip CHIP2 and the second side surface AMK1b of the first alignment mark AMK1 are collinear). As another example, unlike the structure depicted in the drawings, the end surface CHIPe of the second semiconductor chip CHIP2 and the third side surface AMK1c of the first alignment mark AMK1 may be arranged on a straight line parallel to the second direction D2.

The distance CHIP2w between the end surfaces CHIPe of the second semiconductor chips CHIP2 may be equal to the distance AKW between the second side surfaces AMK1b of the first alignment marks AMK1, as illustrated in FIG. 6. In the present specification, the expression "distances are equal to each other" may mean that a difference between the distances is within an error tolerance in a fabrication process. The first alignment marks AMK1 may be metal marks, which are used to dispose the second semiconductor chips CHIP2 at desired positions in a process of stacking the second semiconductor chips CHIP2.

Referring to FIG. 7, the second alignment marks AMK2, the first coupling pads BFG1, and a portion of the circuit line CLI may be disposed in the second open region OPN2 of the solder resist layer SR on the board PSUB. The circuit line CLI may include a first line side surface CLIa and a second line side surface CLIb, which are opposite to each other. The first line side surface CLIa of the circuit line CLI may be exposed to the outside, in the second open region OPN2. The second line side surface CLIb of the circuit line CLI may be covered with the solder resist layer SR. However, unlike the structure depicted in the drawings, in the case where an area of the second open region OPN2 is changed, the second line side surface CLIb of the circuit line CLI may be exposed to the outside.

The second alignment marks AMK2 may be connected to the first line side surface CLIa of the circuit line CLI and may be spaced apart from each other in the first direction D1. The second alignment marks AMK2 may be extended from the first line side surface CLIa in the second direction D2. The second alignment mark AMK2 may include a stub of the circuit line CLI. In other words, the second alignment mark AMK2 may be formed by forming a stub on the circuit line CLI. One of the second alignment marks AMK2, which is adjacent to the outermost edge of the second semiconductor chip CHIP2, may have an uneven shape corresponding to a corner of the second semiconductor chip CHIP2.

Except for the afore-described features, the shapes and arrangement of the second alignment marks AMK2 may be substantially the same as those of the first alignment marks AMK1.

According to an embodiment of the inventive concept, the first portion P1 of the first coupling pad BFG1 may be disposed on the board PSUB and between the first alignment marks AMK1 or between the second alignment marks AMK2, and this may make it possible to prevent a short circuit from being formed between the first coupling pads BFG1 and the first alignment marks AMK1.

FIGS. 8A to 12B illustrate a method of fabricating a semiconductor package, according to an embodiment of the inventive concept. FIGS. 8A, 9A, 10A, 11A, and 12A are plan views illustrating a method of fabricating a semiconductor package, according to an embodiment of the inventive concept. FIGS. 8B, 9B, 10B, 11B, and 12B are sectional views taken along lines 1-1' of FIGS. 8A, 9A, 10A, 11A, and 12A, respectively. Hereinafter, a method of fabricating a semiconductor package, according to an embodiment of the inventive concept, will be described in more detail with reference to FIGS. 1, 3, and 8A to 12B.

Figure 8A:
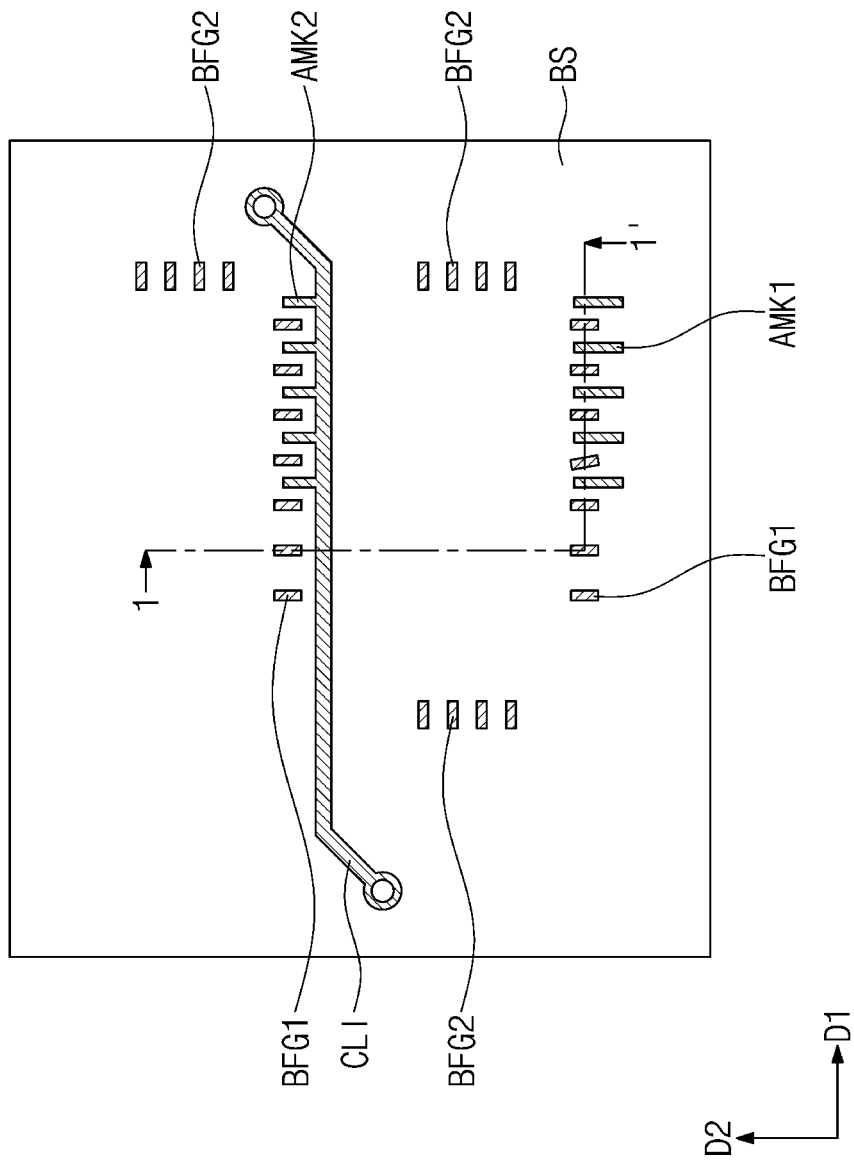
FIGS. 8A, 9A, 10A, 11A, and 12A are plan views illustrating methods of fabricating a semiconductor package, according to an embodiment of the inventive concept.
Figure 8B:
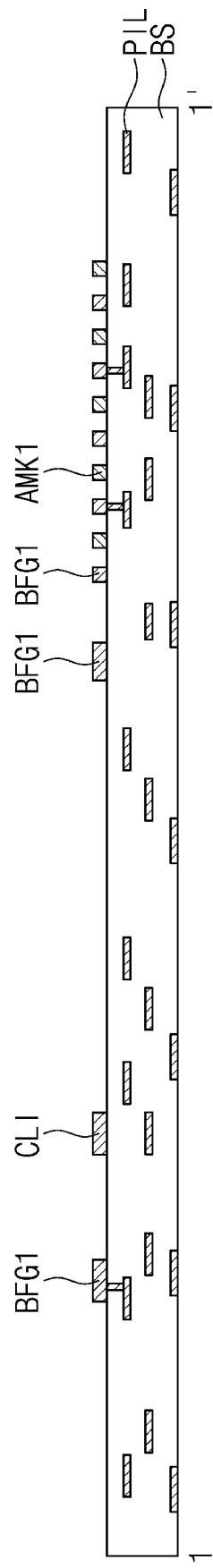
FIGS. 8B, 9B, 10B, 11B, and 12B are sectional views taken along lines 1-1' of FIGS. 8A, 9A, 10A, 11A, and 12A, respectively.

Referring to FIGS. 8A and 8B, the base layer BS with the board lines PIL may be provided. The circuit line CLI, the coupling pads BFG1 and BFG2, and the alignment marks AMK1 and AMK2 may be formed on the top surface of the base layer BS.

The formation of the circuit line CLI may include forming a metal layer on the top surface of the base layer BS and patterning the metal layer. The coupling pads BFG1 and BFG2 and the alignment marks AMK1 and AMK2 may be formed using the process of forming the circuit line CLI. For example, the metal layer may be formed on the top surface of the base layer BS and may be patterned to form the circuit line CLI as well as the coupling pads BFG1 and BFG2 and the alignment marks AMK1 and AMK2.

The alignment marks AMK1 and AMK2 may include the first alignment marks AMK1 and the second alignment marks AMK2. The first alignment marks AMK1 may be formed to be spaced apart from each other and to be electrically disconnected from each other. The second alignment marks AMK2 may be formed to be connected to the circuit line CLI. The first and second alignment marks AMK1 and AMK2 may be formed to indicate a region, on which the second semiconductor chips CHIP2 will be formed.

The coupling pads BFG1 and BFG2 may include the first coupling pads BFG1 and the second coupling pads BFG2. The first coupling pads BFG1 may be arranged in the first direction D1. The second coupling pads BFG2 may be arranged in the second direction D2. At least one of the first coupling pads BFG1 may include a first portion that is provided between the first alignment marks AMK1. The first coupling pads BFG1 and the first alignment marks AMK1 may be disposed to be spaced apart from each other. In other words, the first coupling pads BFG1 and the first alignment marks AMK1 may be electrically disconnected from each other.

As described above, the first coupling pad BFG1 may be electrically connected to the first semiconductor chip CHIP1, and the second coupling pad BFG2 may be electrically connected to the second semiconductor chip CHIP2.

Figure 9A:
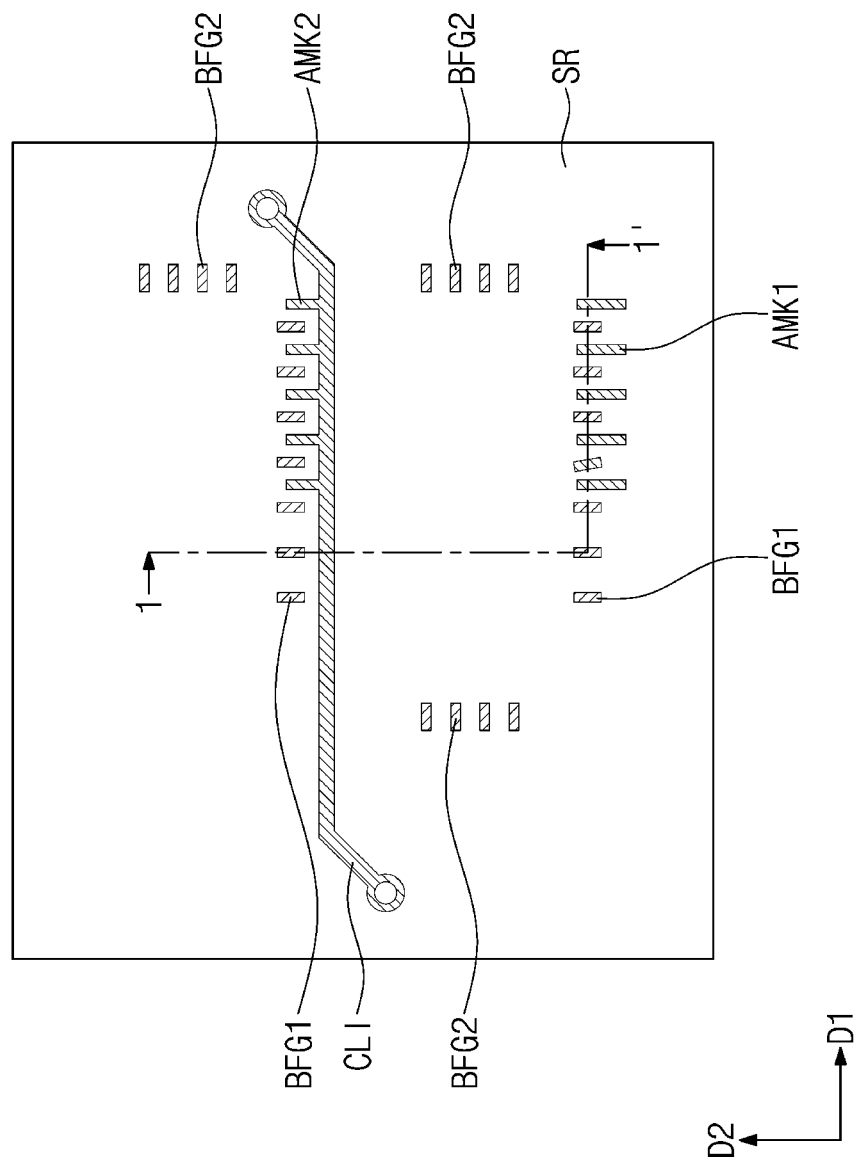
Figure 9B:
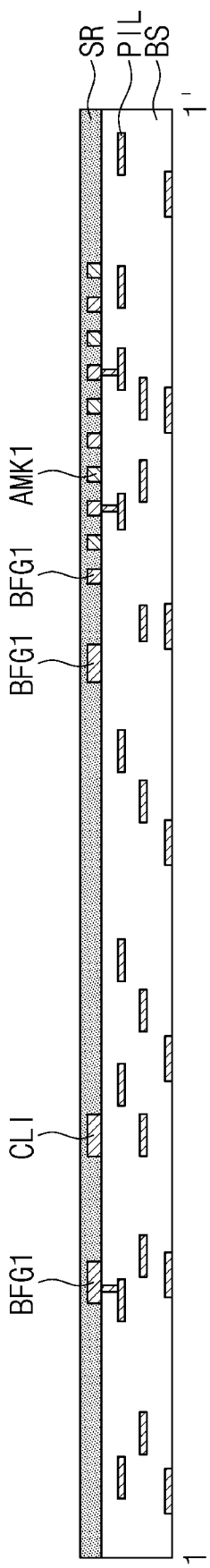

Referring to FIGS. 9A and 9B, the solder resist layer SR may be formed on the top surface of the base layer BS. The solder resist layer SR may be formed to cover the coupling pads BFG1 and BFG2 and the alignment marks AMK1 and AMK2.

Figure 10A:
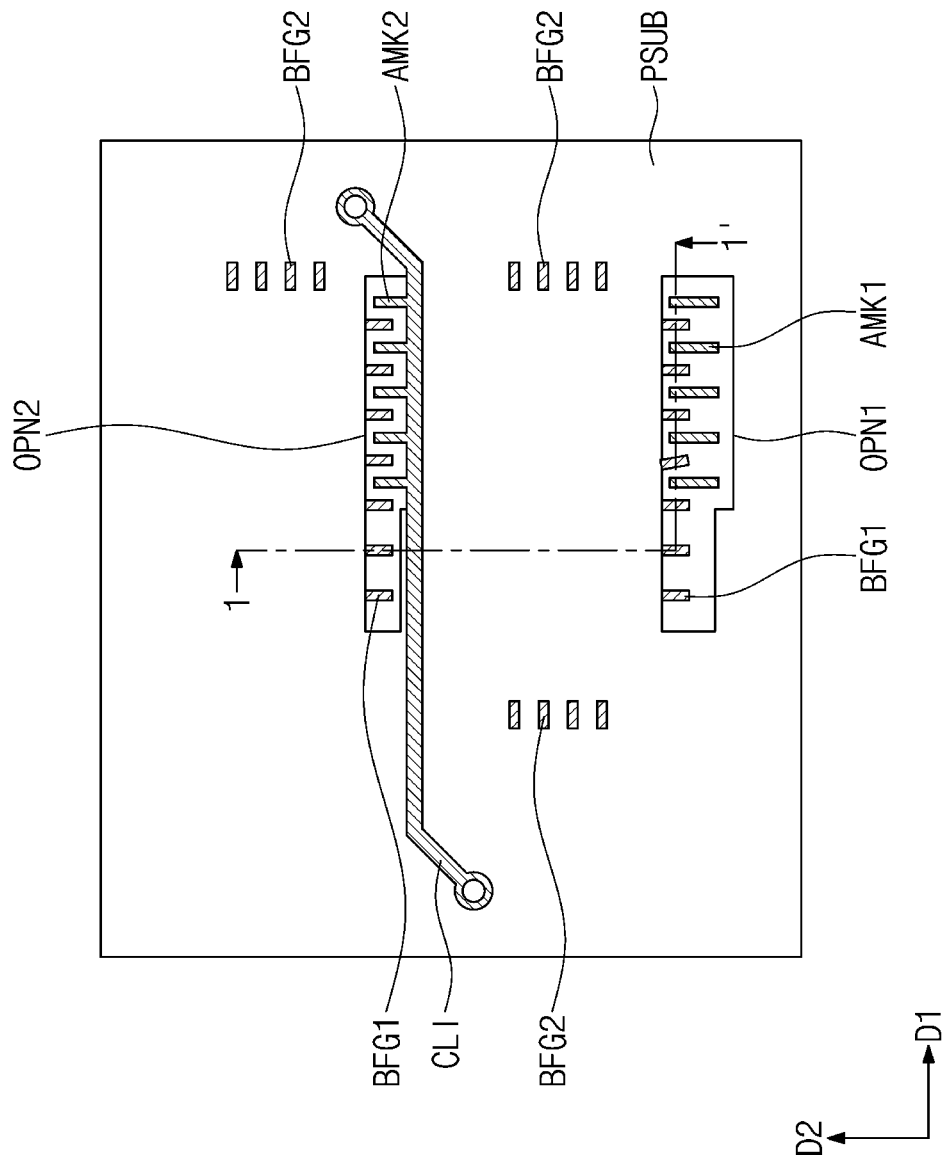
Figure 10B:
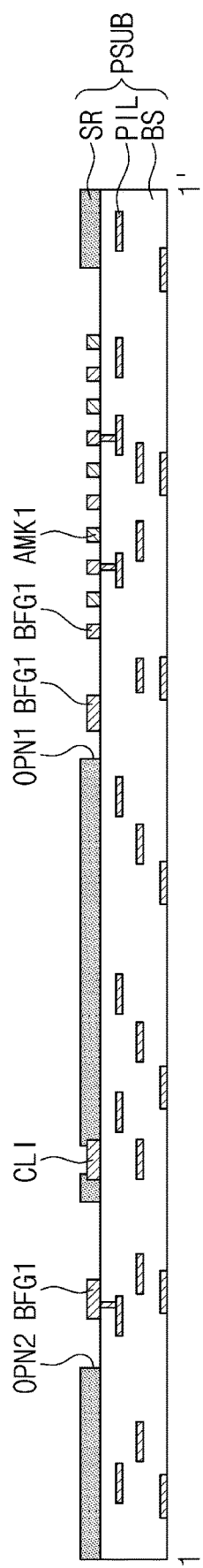

Referring to FIGS. 10A and 10B, the first open region OPN1 and the second open region OPN2 may be formed by partially removing the solder resist layer SR. The first alignment marks AMK1 may be exposed to the outside through the first open region OPN1. The second alignment marks AMK2 may be exposed to the outside through the second open region OPN2. Another portion of the solder resist layer SR may be removed to expose a portion of the top surface of the circuit line CLI.

Although not shown, a plating process may be further performed on outwardly-exposed surfaces of the circuit line CLI and the coupling pads BFG1 and BFG2. The plating process may include an electroplating process. The plating process may be performed on surfaces of the alignment marks AMK1 and AMK2. The plating process may include a nickel or gold plating process.

As a result of the formation of the solder resist layer SR, the board PSUB including the solder resist layer SR and the base layer BS may be formed.

Figure 11A:
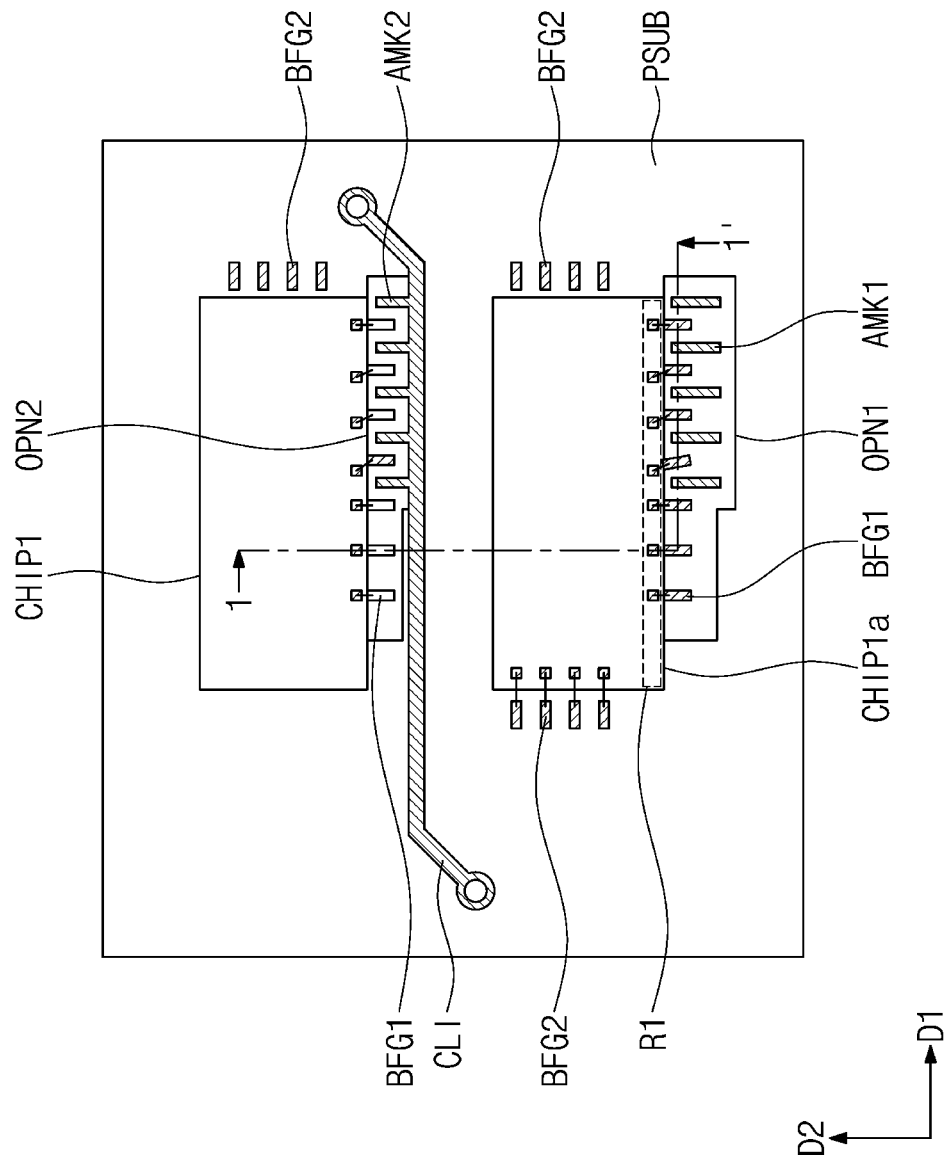
Figure 11B:
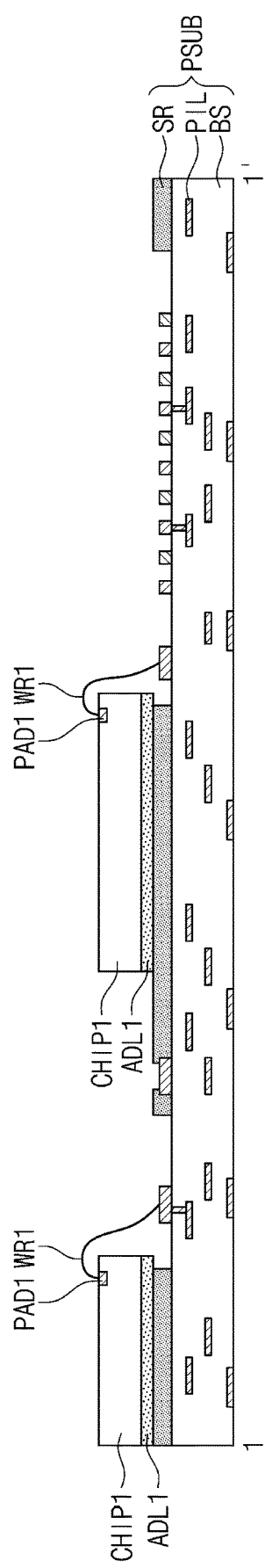

Referring to FIGS. 11A and 11B, the first semiconductor chip CHIP1 may be mounted on the board PSUB. The mounting of the first semiconductor chip CHIP1 may include forming the first adhesive layer ADL1 on a surface of the first semiconductor chip CHIP1 and attaching the first adhesive layer ADL1 to the board PSUB.

The first semiconductor chip CHIP1 may include the first chip side surface CHIP1a. The first chip side surface CHIP1a may be disposed to be parallel to the first direction D1 and to be adjacent to the first coupling pads BFG1. The first semiconductor chip CHIP1 may include the first region R1. The first region R1 of the first semiconductor chip CHIP1 may be adjacent to the first chip side surface CHIP1a of the first semiconductor chip CHIP1. The first signal pads PAD1 may be provided on the top surface of the first semiconductor chip CHIP1. The first signal pads PAD1 may be provided on the first region R1.

The first signal connecting portions WR1 may be formed on the first signal pads PAD1 on the first semiconductor chip CHIP1. The first signal connecting portion WR1 may be coupled to the first signal pad PAD1 and the first coupling pad BFG1 corresponding thereto. The formation of the first signal connecting portion WR1 may include binding an end surface of the first signal connecting portion WR1 to a top surface of the first coupling pad BFG1 and bonding an opposite end surface of the first signal connecting portion WR1 to the first signal pad PAD1.

Figure 12A:
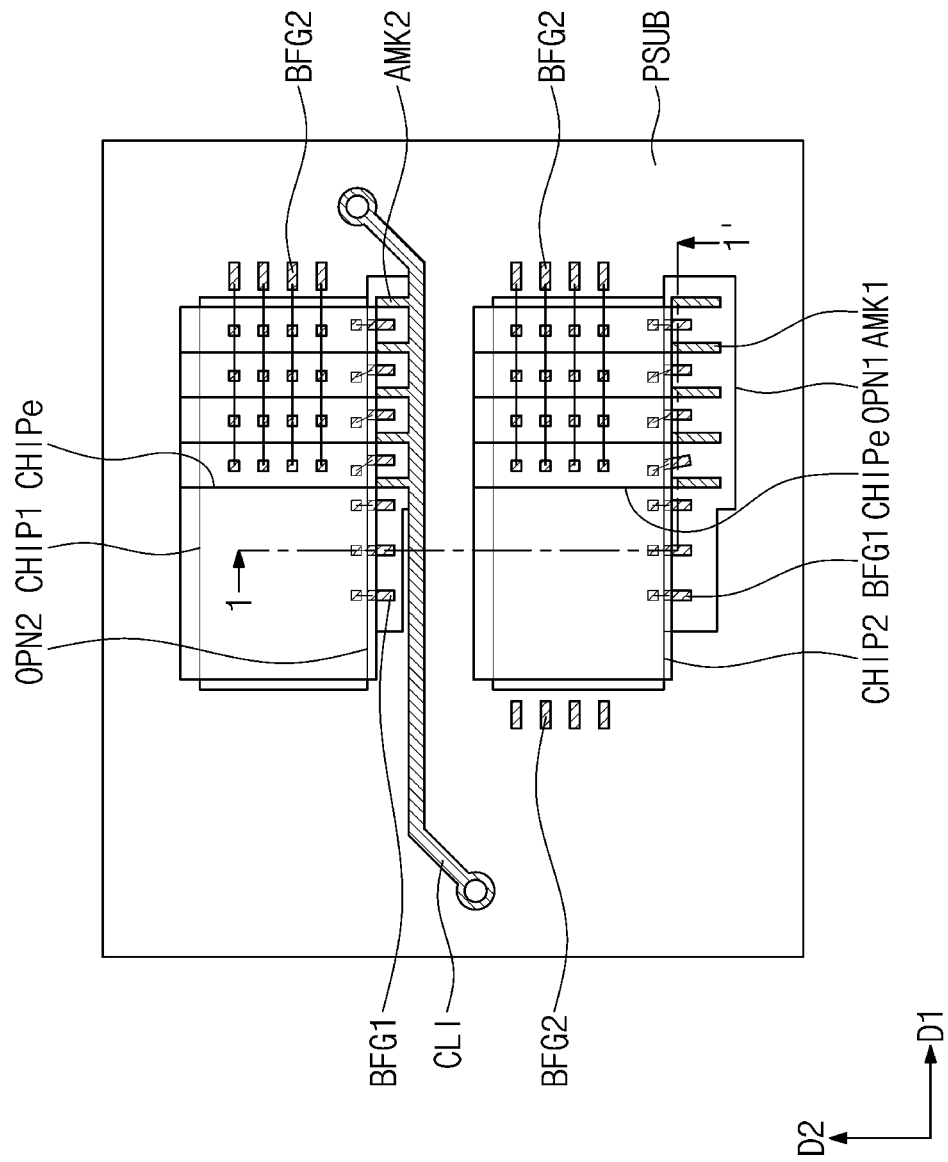
Figure 12B:
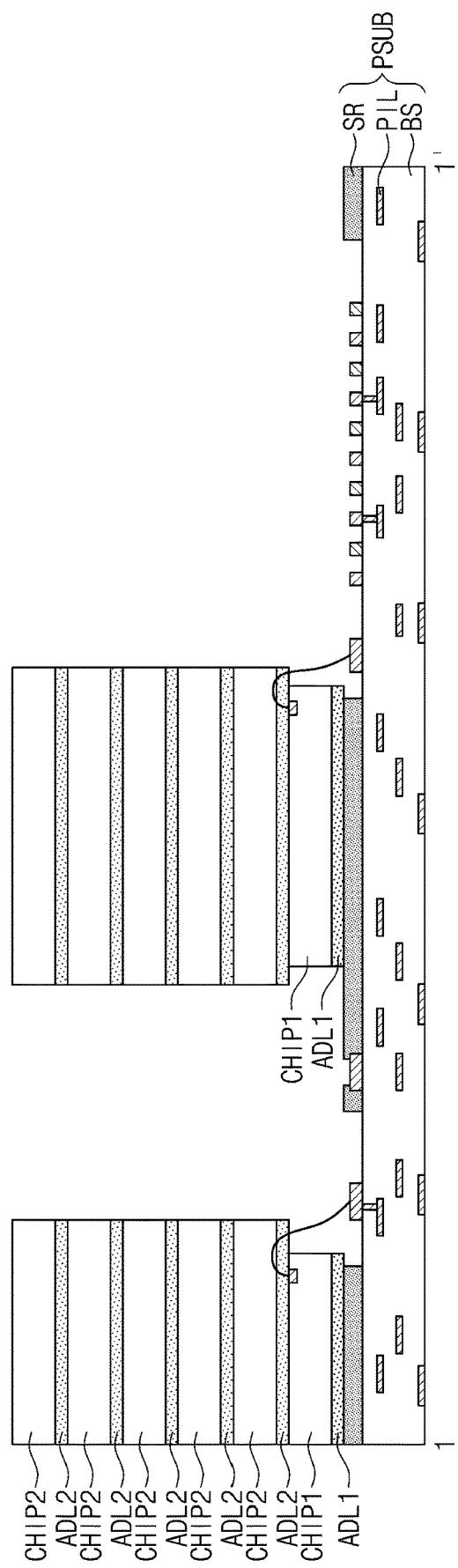

Referring to FIGS. 12A and 12B, the second semiconductor chips CHIP2 may be sequentially stacked on the first semiconductor chip CHIP1. The stacking of the lowermost one of the second semiconductor chips CHIP2 may include forming the second adhesive layer ADL2 on a bottom surface of the second semiconductor chip CHIP2 and attaching the second adhesive layer ADL2 to the top surface of the first semiconductor chip CHIP1. The first signal connecting portions WR1 may pass through the second adhesive layer ADL2 attached to the top surface of the first semiconductor chip CHIP1. Next, remaining second semiconductor chips CHIP2 may be sequentially stacked on the lowermost one of the second semiconductor chips CHIP2.

Stacking positions of the second semiconductor chips CHIP2 may be determined by the alignment marks AMK1 and AMK2. Each of the second semiconductor chips CHIP2 may include the end surface CHIPe. The end surface CHIPe of the second semiconductor chip CHIP2 and a side surface of the alignment marks AMK1 or AMK2 corresponding thereto may be located on a straight line (i.e., are collinear). The end surfaces CHIPe of the second semiconductor chips CHIP2 and the side surfaces of the corresponding alignment marks AMK1 or AMK2 may be located on respective straight lines (i.e., are collinear). For example, in the process of stacking the second semiconductor chips CHIP2, each of the second semiconductor chips CHIP2 may be placed such that its end surface CHIPe is aligned to a side surface of a corresponding one of the alignment marks AMK1 or AMK2 and then may be attached to the board PSUB.

Referring back to FIGS. 1 and 3, the mold layer MOL may be formed on the board PSUB. The mold layer MOL may be formed to cover the solder resist layer SR, the alignment marks AMK1 and AMK2, the coupling pads BFG1 and BFG2, the first semiconductor chip CHIP1, and the second semiconductor chips CHIP2. The mold layer MOL may be formed of or include an insulating polymer (e.g., an epoxy-based molding compound). The terminals SB may be formed on the bottom surface of the board PSUB. The terminals SB may include solder balls. The terminals SB may be electrically connected to the board PSUB. The first semiconductor chip CHIP1 and the second semiconductor chips CHIP2 may be electrically connected to the external device through the terminals SB.

Figure 13:
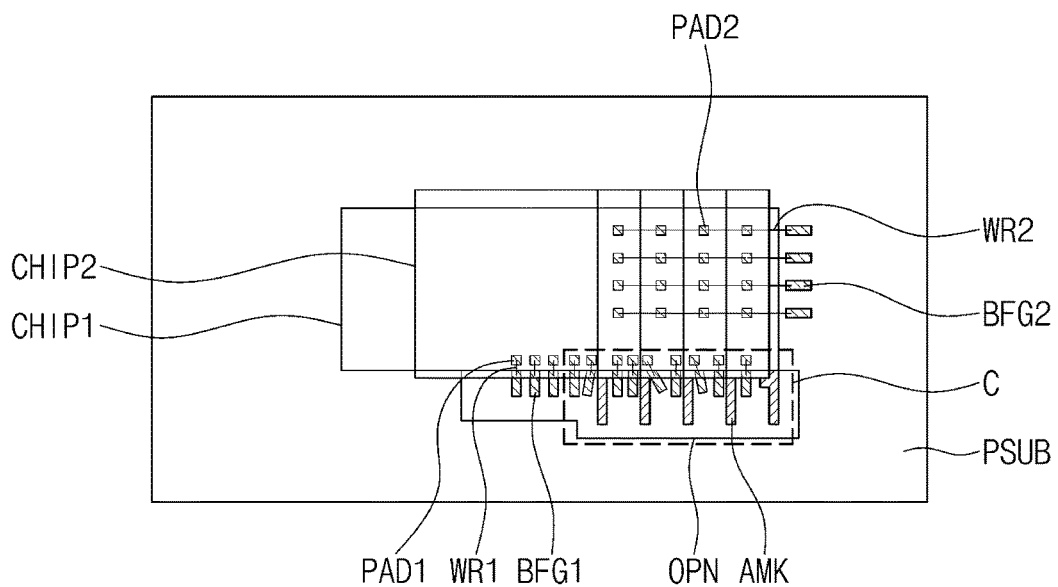
FIG. 13 is a plan view illustrating a semiconductor package according to an embodiment of the inventive concept.
Figure 14:
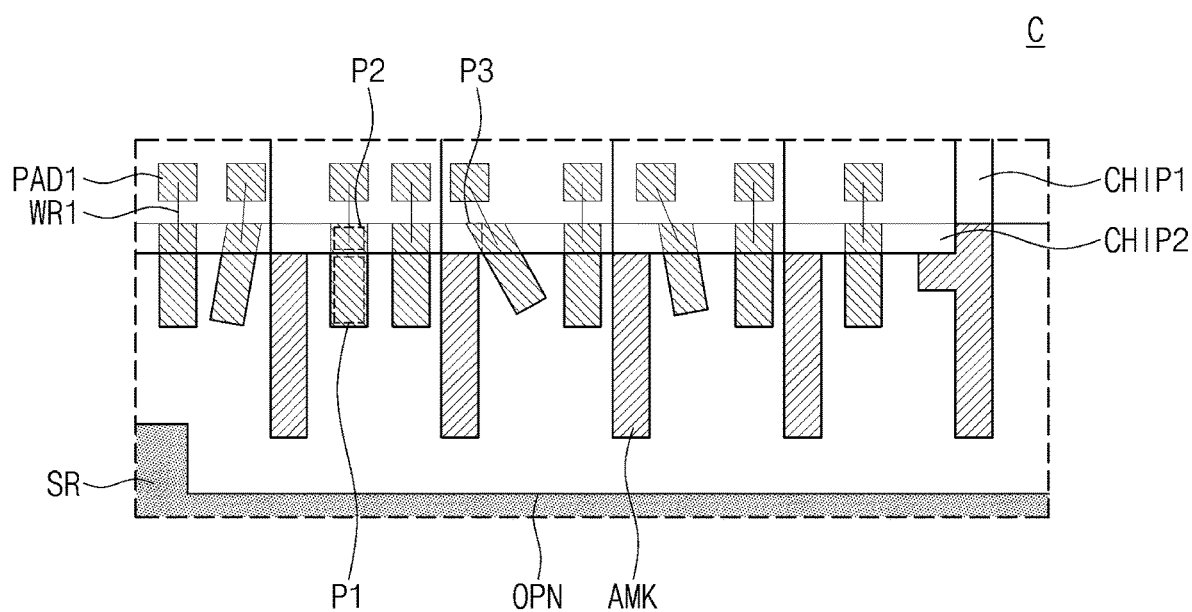
FIG. 14 is an enlarged plan view illustrating a portion 'C' of FIG. 13.

FIG. 13 is a plan view illustrating a semiconductor package according to an embodiment of the inventive concept. FIG. 14 is an enlarged plan view illustrating a portion 'C' of FIG. 13. In the following description, an element previously described with reference to FIGS. 1 to 7 may be identified by the same reference number without repeating an overlapping description thereof, for concise description.

Referring to FIGS. 13 and 14, a package according to an embodiment of the inventive concept may include the board PSUB including an open region, the first semiconductor chip CHIP1 mounted on the board PSUB, and the second semiconductor chips CHIP2 stacked on the first semiconductor chip CHIP1. The structure and arrangement of the board PSUB, the first semiconductor chip CHIP1, and the second semiconductor chips CHIP2 may be the same as those in FIGS. 1 to 5.

In an embodiment, alignment marks AMK and the coupling pads BFG1 and BFG2 may be provided on the top surface of the board PSUB. The coupling pads BFG1 and BFG2 may include the first coupling pads BFG1 and the second coupling pads BFG2. The first signal pads PAD1 may be provided on the first semiconductor chip CHIP1, and the second signal pads PAD2 may be provided on the second semiconductor chip CHIP2. The first signal connecting portion WR1 may be provided on the first signal pad PAD1 and may be coupled to the first coupling pad BFG1. The second signal connecting portion WR2 may be provided on second signal pad PAD2 and may be coupled to the second coupling pad BFG2. The first semiconductor chip CHIP1 may be electrically connected to the board PSUB through the first signal connecting portion WR1, and the second semiconductor chip CHIP2 may be electrically connected to the board PSUB through the second signal connecting portion WR2.

The alignment marks AMK may be disposed on the open region. The structure and arrangement of the alignment marks AMK may be the same as those of the first alignment marks AMK1 in FIGS. 1 and 6.

The first coupling pads BFG1 may be disposed on the open region. The first coupling pads BFG1 may include the first portion P1 and the second portion P2. The first portion P1 may be defined as a portion of the first coupling pad BFG1, which is provided between the alignment marks AMK. The second portion P2 may be defined as a portion of the first coupling pad BFG1 excluding the first portion P1.

In an embodiment, the first portions P1 may be provided between the alignment marks AMK. As an example, the first portions P1 may be disposed between a pair of the alignment marks AMK.

In an embodiment, a portion P3 of the second portions P2 of the first coupling pad BFG1 may be partially overlapped with the alignment marks AMK in the second direction D2. For example, the first portion P1 of the first coupling pad BFG1 may be disposed between the pair of the alignment marks AMK, and the portion P3 of the second portion P2 may be overlapped with the alignment mark AMK in the second direction D2.

Figure 15:
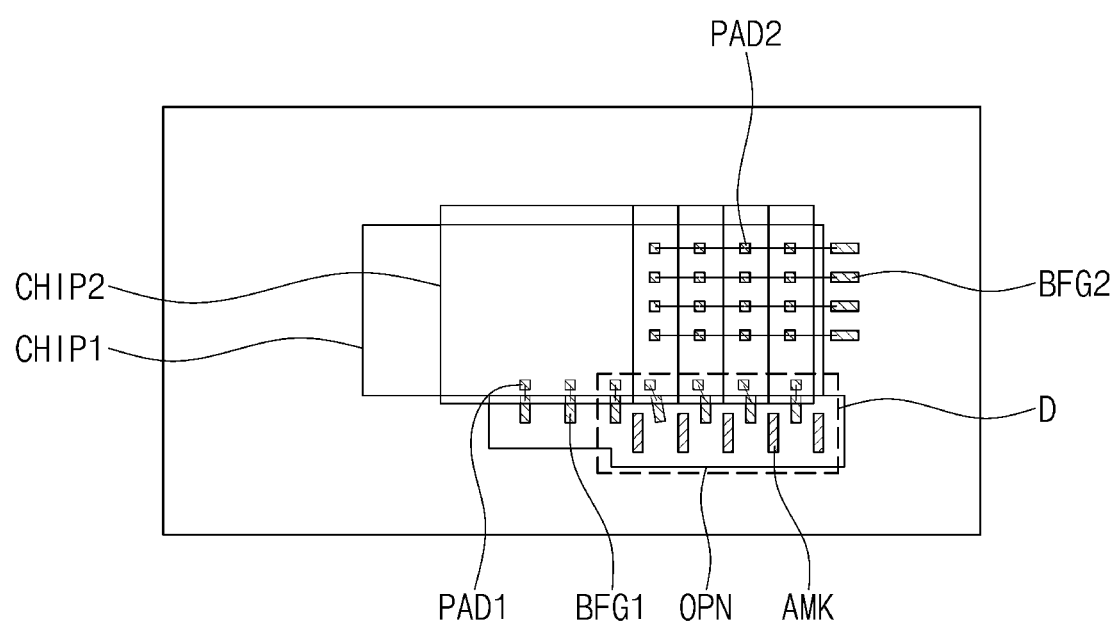
FIG. 15 is a diagram illustrating a semiconductor package according to an embodiment of the inventive concept.
Figure 16:
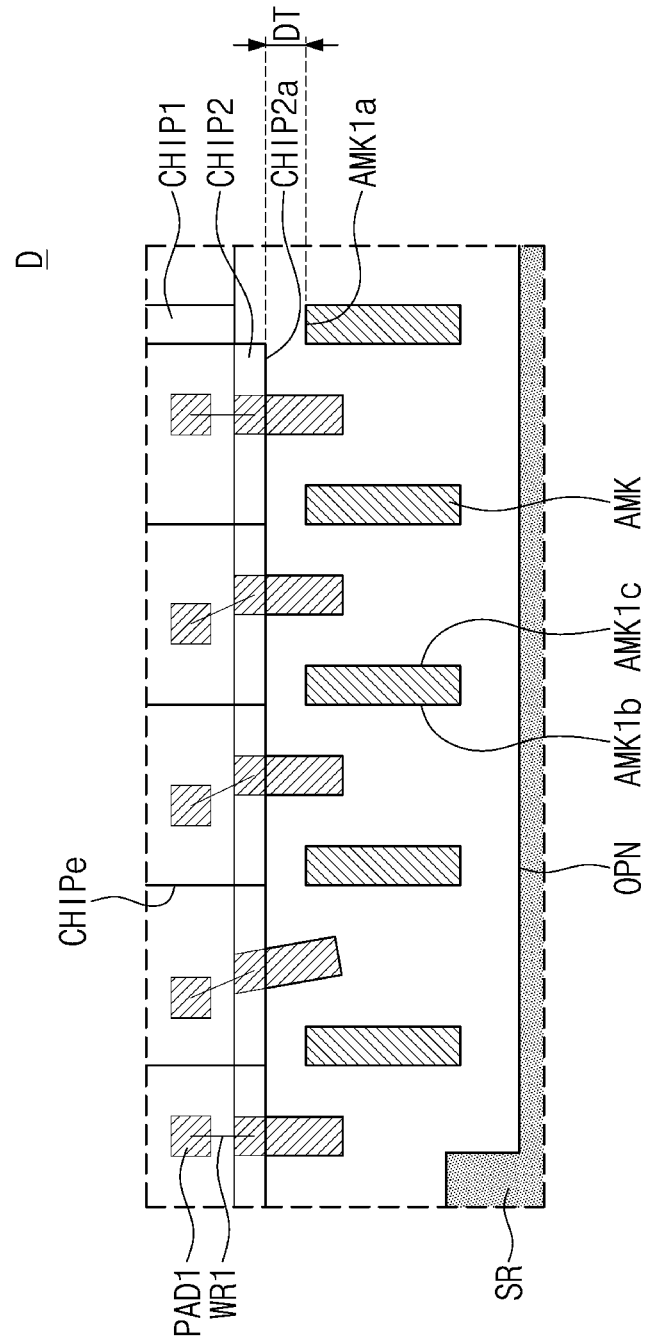
FIG. 16 is an enlarged plan view illustrating a portion 'D' of FIG. 15.

FIG. 15 is a diagram illustrating a semiconductor package according to an embodiment of the inventive concept. FIG. 16 is an enlarged plan view illustrating a portion 'D' of FIG. 15. In the following description, an element previously described with reference to FIGS. 1 to 7 may be identified by the same reference number without repeating an overlapping description thereof, for concise description.

Referring to FIG. 15, a semiconductor package according to an embodiment of the inventive concept may include the board PSUB including an open region OPN, the first semiconductor chip CHIP1 mounted on the board PSUB, and the second semiconductor chips CHIP2 stacked on the first semiconductor chip CHIP1. The structure and arrangement of the board PSUB, the first semiconductor chip CHIP1, and the second semiconductor chips CHIP2 may be the same as those in FIGS. 1 to 5.

In an embodiment, the alignment marks AMK and the coupling pads BFG1 and BFG2 may be provided on the top surface of the board PSUB. The coupling pads BFG1 and BFG2 may include the first coupling pads BFG1 and the second coupling pads BFG2. The first signal pads PAD1 may be provided on the first semiconductor chip CHIP1, and the second signal pads PAD2 may be provided on the second semiconductor chip CHIP2. The first signal connecting portion WR1 may be provided on the first signal pad PAD1 and may be coupled to the first coupling pad BFG1. The second signal connecting portion WR2 may be provided on second signal pad PAD2 and may be coupled to the second coupling pad BFG2. The first semiconductor chip CHIP1 may be electrically connected to the board PSUB through the first signal connecting portion WR1, and the second semiconductor chip CHIP2 may be electrically connected to the board PSUB through the second signal connecting portion WR2.

The alignment marks AMK may be disposed on the open region OPN. The alignment marks AMK may include the first side surface AMK1a, which is parallel to the first direction D1, the second side surface AMK1b, which is perpendicular to the first side surface AMK1a and parallel to the second direction D2, and the third side surface AMK1c, which is parallel to the second direction D2 and is opposite to the second side surface AMK1b. The first side surfaces AMK1a of the alignment marks AMK may be disposed on a straight line parallel to the first direction D1.

Each of the second semiconductor chips CHIP2 may include the second chip side surface CHIP2a and the end surface CHIPe. The second chip side surface CHIP2a may be parallel to the first direction D1. The second chip side surfaces CHIP2a of the second semiconductor chips CHIP2 may be located on a straight line. The end surface CHIPe may be perpendicular to the second chip side surface CHIP2a, and in an embodiment, the end surface CHIPe, along with the second side surfaces AMK1*b* of the alignment marks AMK, may be disposed on a straight line. The second chip side surfaces CHIP2*a* of the second semiconductor chips CHIP2 may be disposed to be parallel to the first side surfaces AMK1*a* of the alignment marks AMK.

In an embodiment, the second chip side surface CHIP2*a* and the first side surface AMK1*a* may be spaced apart from each other. A distance DT between the second chip side surface CHIP2*a* and the first side surface AMK1*a* may range from 10 µm to 100 µm.

In a printed circuit board according to an embodiment of the inventive concept, it may be possible to prevent a short circuit from being formed between an alignment mark and a coupling pad.

While example embodiments of the inventive concept have been particularly shown and described, it will be understood by one of ordinary skill in the art that variations in form and detail may be made therein without departing from the scope of the attached claims.

What is claimed is:

1. A semiconductor package, comprising:
   a board;
   a first semiconductor chip mounted on the board; and
   a plurality of second semiconductor chips stacked on the first semiconductor chip,
   wherein the board comprises:
      alignment marks on a top surface of the board and arranged in spaced apart relationship along a first direction, wherein each alignment mark comprises a first side surface parallel to the first direction and a second side surface parallel to a second direction that is perpendicular to the first direction; and
      a coupling pad on the top surface of the board between a pair of adjacent alignment marks,
   wherein the first side surfaces of the alignment marks are collinear in the first direction,
   wherein each of the second semiconductor chips comprises an end surface parallel to the second direction, and
   wherein the end surface of each of the second semiconductor chips is collinear with a second side surface of a respective one of the alignment marks.

2. The semiconductor package of claim 1, wherein the end surface of each of the second semiconductor chips and the second side surface of the respective one of the alignment marks is collinear in the second direction.

3. The semiconductor package of claim 1, wherein the coupling pad comprises a first portion between the pair of adjacent alignment marks, and a second portion.

4. The semiconductor package of claim 3, wherein the second portion extends from the first portion in the second direction beyond the first side surfaces of the pair of adjacent alignment marks.

5. The semiconductor package of claim 3, wherein the first portion extends in a direction that is transverse to both of the first and second directions.

6. The semiconductor package of claim 1, wherein the coupling pad comprises a plurality of coupling pads, wherein each coupling pad is between a respective pair of adjacent alignment marks.

7. The semiconductor package of claim 1, wherein the alignment marks are electrically disconnected from the coupling pad.

8. The semiconductor package of claim 1, wherein each of the second semiconductor chips comprises a second chip side surface parallel to the first direction, and
   wherein the second chip side surface of each of the second semiconductor chips is collinear with the first side surface of a respective one of the alignment marks.

9. The semiconductor package of claim 1, further comprising a solder resist layer on the top surface of the board,
   wherein the solder resist layer comprises an open region, and
   the alignment marks are in the open region.

10. The semiconductor package of claim 1, wherein the board comprises board lines, and
    the coupling pad is electrically connected to the board lines.

11. A semiconductor package, comprising:
    a board;
    a first semiconductor chip mounted on the board; and
    a plurality of second semiconductor chips stacked on the first semiconductor chip,
    wherein the board comprises:
       a base layer;
       a circuit line on the base layer, wherein the circuit line extends in a first direction, and wherein the circuit line comprises a first line side surface and a second line side surface;
       alignment marks extending from the first line side surface of the circuit line in a second direction perpendicular to the first direction, wherein each alignment mark comprises a first side surface parallel to the first direction and a second side surface parallel to the second direction; and
       a coupling pad on the base layer and spaced apart from the alignment marks, wherein the first side surfaces of the alignment marks are collinear in the first direction, the coupling pad comprises a first portion and a second portion,
    the first portion of the coupling pad is between an adjacent pair of the alignment marks, and
    the second portion extends from the first portion in the second direction beyond the first side surfaces of the adjacent pair of alignment marks.

12. The semiconductor package of claim 11, wherein the alignment marks and the circuit line form a single object and comprise a same material.

13. The semiconductor package of claim 11, wherein each alignment mark comprises a stub of the circuit line.

14. The semiconductor package of claim 11, wherein each of the second semiconductor chips comprises a second chip side surface parallel to the first direction, and
    wherein the second chip side surfaces of the second semiconductor chips are collinear with the first side surfaces of the alignment marks.

15. The semiconductor package of claim 11, wherein each of the second semiconductor chips comprises a second chip side surface parallel to the first direction, and
    the second chip side surfaces of the second semiconductor chips are spaced apart from the first side surfaces of the alignment marks.

16. The semiconductor package of claim 11, wherein the board comprises board lines, and
    wherein the coupling pad is electrically connected to the board lines.

17. The semiconductor package of claim 11, wherein each of the second semiconductor chips comprises an end surface parallel to the second direction, and
    wherein a distance between the end surfaces of adjacent ones of the second semiconductor chips is equal to a distance between the adjacent ones of the alignment marks.

18. A board, comprising:
a base layer;
alignment marks on the base layer and arranged in spaced apart relationship along a first direction, wherein each alignment mark comprises a first side surface parallel to the first direction and a second side surface parallel to a second direction perpendicular to the first direction; and
a coupling pad on the base layer and spaced apart from the alignment marks,
wherein the first side surfaces of the alignment marks are collinear in the first direction,
wherein the coupling pad comprises a first portion and a second portion,
wherein the first portion of the coupling pad is between a pair of adjacent alignment marks, and
wherein the second portion extends from the first portion in the second direction beyond the first side surfaces of the pair of adjacent alignment marks.

19. The board of claim 18, further comprising a board line in the base layer,
wherein the coupling pad is electrically connected to the board line.

20. The board of claim 18, further comprising a solder resist layer on the base layer,
wherein the solder resist layer comprises an open region, and
wherein the alignment marks are in the open region.

* * * * *